Feb. 20, 1968 YOSHIO KAGEYAMA ET AL 3,370,240

FREQUENCY DISCRIMINATOR USING FOUR TUNING CIRCUITS

Filed Oct. 16, 1964

INVENTOR.
Yoshio Kageyama
Yasusuke Katsuda

BY

Wesley & Wesley

United States Patent Office
3,370,240
Patented Feb. 20, 1968

3,370,240

FREQUENCY DISCRIMINATOR USING FOUR TUNING CIRCUITS

Yoshio Kageyama and Yasusuke Katsuda, Yokohama-shi, Japan, assignors to Kabushiki Kaisha Hitachi Seisakusho, Tokyo-to, Japan, a joint-stock company of Japan Filed Oct. 16, 1964, Ser. No. 404,258
Claims priority, application Japan, Oct. 17, 1963, 38/54,846
2 Claims. (Cl. 329—112)

ABSTRACT OF THE DISCLOSURE

A frequency discriminator which uses four tuning circuits. Each of these consists of a series connection of a series tuning circuit and a parallel tuning circuit and operates on a frequency tuned to one of two specific frequencies. There also are present two detector circuits to produce outputs which correspond to these two specific frequencies and which are connected to each other in parallel on their series tuning circuit sides. Their two parallel circuit tuning circuits are connected to the respective detector circuits which are selected so that a parameter $\theta_4$, indicating the ratio of the difference of the two specific frequencies from a center frequency, and another parameter $a$, determining the type of each series connection, have the relationship expressed by $$4a\theta_4^2=1$$

The nature and details of the invention will now be described with respect to a preferred embodiment of the invention with reference to the accompanying drawings in which like parts are designated by like reference characters, and in which.

Figure 3:
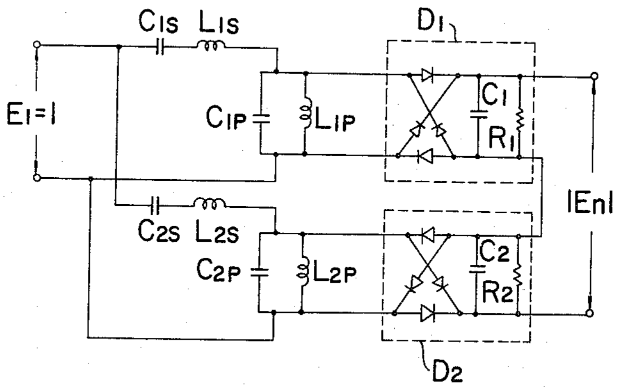
FIG. 3 is a circuit diagram of the embodiment of the four-element discriminator according to the invention.

As indicated in FIG. 3, the discriminator according to the invention is composed of two reverse L-connection circuits connected in parallel, one of which comprises a series tuning circuit of inductance $L_{1s}$ and capacitance $C_{1s}$ and a parallel tuning circuit of inductance $L_{1p}$ and capacitance $C_{1p}$, and the other comprising a series tuning circuit of inductance $L_{2s}$ and capacitance $C_{2s}$ and a parallel tuning circuit of inductance $L_{2p}$ and capacitance $C_{2p}$, the outputs of the two parallel tuning circuits being fed to two detector circuits $D_1$ and $D_2$ respectively arranged in such a manner that a D-C output of the differential sum of two detected signals from the $D_1$ and $D_2$ is delivered.

Here, in each circuit, the following relationships are being satisfied.

$$f_1=\frac{1}{2\pi\sqrt{L_{1s}C_{1s}}}=\frac{1}{2\pi\sqrt{L_{1p}C_{1p}}}$$

$$f_2=\frac{1}{2\pi\sqrt{L_{2s}C_{2s}}}=\frac{1}{2\pi\sqrt{L_{2p}C_{2p}}}$$

For the detector circuits $D_1$ and $D_2$, any of the well-known circuits can be used, e.g., two diode bridge rectifiers as indicated in the drawing are connected to filter capacitors $C_1$ and $C_2$ and load resistors $R_1$ and $R_2$.

The term "reverse L" is to denate the configuration of the networks in cascade form. When the circuitry is seen from the side of the terminals, the impedances in the networks are series connected, and the entire circuitry assumes the shape of a reverse letter L.

The term "two-element discriminator" designates passive elements constituting a tuning circuit which is the principal component of the discriminator; the tuning circuit itself comprises one inductor and one capacitor for one frequency. Other elements, such as a diode bridge, smoothing low pass filter, etc., indispensable in a discriminator, are not taken into account. The "four-element discriminator" according to the invention includes a series tuning circuit and a parallel tuning circuit, both composed of the element named above, with respect to one frequency. Thus, in the prior art, shown in FIGS. 1 and 2, the discriminator has the tuning circuits $L_1$–$C_1$ and $L_2$–$C_2$, whereas FIG. 3 shows four tuning circuits $C_{1s}$–$L_{1s}$, $C_{2s}$–$L_{2s}$, $C_{1p}$–$L_{1p}$ and $C_{2p}$–$L_{2p}$. The term "element" therefore is interchangeable with "tuning circuit."

Figure 1:
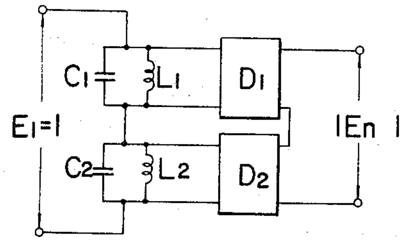
FIG. 1 PRIOR ART
FIG. 1 and FIG. 2 are the circuit diagrams of examples of the conventional two-element discriminator.

To compare this four-element discriminator with the conventional two-element discriminator indicated in FIG. 1, the following parameters are defined.

In the two-element discriminator, $$\theta_2=R\cdot\frac{1}{z}\cdot\frac{f_2-f_1}{f_0} \quad (1)$$

where:

$$Z=\sqrt{\frac{L_1}{C_1}}=\sqrt{\frac{L_2}{C_2}}$$

$$f_1=\frac{1}{2\pi\sqrt{L_1C_1}}$$

$$f_2=\frac{1}{2\pi\sqrt{L_2C_2}}$$

R is an equivalent resistance to be connected to a parallel tuning circuit as indicated in FIG. 1; and $f_0=\sqrt{f_1f_2}$ is the center frequency.

Similarly, in the four-element discriminator, $$\theta_4=\frac{1}{R}zs\cdot\frac{f_2-f_1}{f_0} \quad (2)$$

$$a=R^2\sqrt{\frac{C_{1s}C_{1p}}{L_{1s}L_{1p}}}=R^2\sqrt{\frac{C_{2s}C_{2p}}{L_{2s}L_{2p}}} \quad (3)$$

where:

$$zs\sqrt{\frac{L_{1s}}{C_{1s}}}=\sqrt{\frac{L_{2s}}{C_{2s}}}$$

$$f_1=\frac{1}{2\pi\sqrt{L_{1s}C_{1s}}}=\frac{1}{2\pi\sqrt{L_{1p}C_{1p}}}$$

$$f_2=\frac{1}{2\pi\sqrt{L_{2s}C_{2s}}}=\frac{1}{2\pi\sqrt{L_{2p}C_{2p}}}$$

$f_0=\sqrt{f_1f_2}$; and

R denotes an equivalent resistance as in the case of the two-element discriminator.

Accordingly, $\theta_2$ and $\theta_4$ are parameters indicating the ratio of $\Delta f=f_2-f_1$ to the center frequency, $a$ is a specific parameter indicating the type of the above said reverse L-connection circuit.

Figure 2:
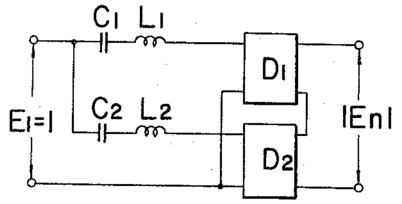
FIG. 2 PRIOR ART

The description given for FIG. 1 is equally valid for FIG. 2 when Equation 1 is modified as follows:

$$\theta_2=\frac{1}{R}\cdot Z\cdot\frac{f_2-f_1}{f_0}$$

Figure 4A:
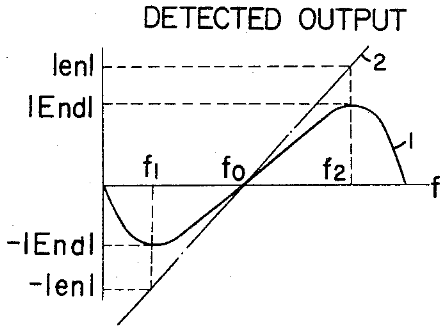
FIGS. 4(*a*) and 4(*b*) are curves indicating linearity of detected output of the discriminator and the input impedance.
Figure 4B:
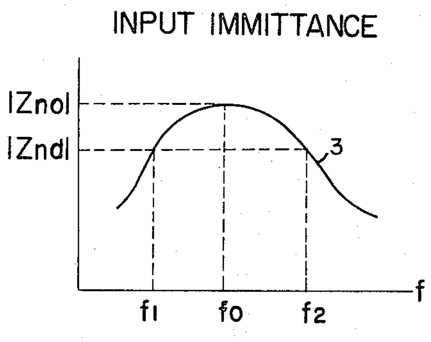

Using these parameters, the normalized detected output $|En_a|$ indicating detecting efficiency for the frequencies $f_1$ and $f_2$, and values $|en|$ indicating linearity of detected output which are intersects of the tangent of the output curve at the point $f_0$ with the two vertical lines at $f_1$ and $f_{2'}$ as well as the normalized input immitances $|Zn_\alpha|$ and $|Zn_0|$ for the frequency $f_1$ and $f_2$ and the center frequency $f_0$ respectively, which are indicated in FIGS. 4(*a*) and 4(*b*), are calculated for the two-element discriminator and the four-element discriminator as follows:

For the two-element discriminator, $$|En_\alpha|=\frac{[1+4\theta_2^2]^{1/2}-1}{2[1+\theta_2^2]^{1/2}} \quad (4)$$

$$|en|=\frac{\theta_2^2}{[1+\theta_2^2]^{1/2}} \quad (5)$$

$$|Zn_0|=\frac{[1+\theta_2^2]^{1/2}}{[1+4\theta_2^2]^{1/2}} \quad (6)$$

$$|Zn_\alpha|=\frac{1}{1+\theta_2^2} \quad (7)$$

For the four-element discriminator, $$|En_\alpha|=1-[(1-4a\theta_4^2)^2+4\theta_4^2]^{-1/2} \quad (8)$$

$$|en|=2\theta_4^2[2a^2\theta_4^2+1-2a][(1-a\theta_4^2)^2+\theta_4^2]^{-3/2} \quad (9)$$

$$|Zn_\alpha|=\frac{1}{(1-a\theta_4^2)^2+\theta_4^2} \quad (10)$$

The following explanations are furnished with respect to FIGS. 4(*a*) and 4(*b*):

1=normalized detected output curve.
2=tangent of the detected output curve 1 at the point $f_0$.
$|En_\alpha|$=normalized detected output at the frequency $f_2(f_1)$.
$(-|En_\alpha|)$
$|en|$=value of the tangent 2 at the frequency $f_2(f_1)$.
$(-|en|)$
$f$=input signal frequency. Linarity of the output improves as the curve 1 is nearer to the rectilinear line 2. The larger the value of $|En_\alpha|$, the better the detection efficiency.
3=input immittance curve.
$|Zn_0|$=input immittance at the frequency $f_0$
$|Zn_\alpha|$=input immittance at the frequency $f_1$ or $f_2$. The nearer the relationship of $|Zn_\alpha|/|Zn_0|$ to 1, the flatter the input immittance characteristics with respect to frequency.

$$|Zn_0|=\frac{[(1-4a_4^2)^2+4\theta_4^2]^{1/2}}{[(1-2a\theta_4^2)^2+(1+a)^2\theta_4^2]^{1/2}} \quad (11)$$

For two- and four-elemena discriminators, the above values are calculated by the above Equations 4 through 11, by putting $\theta_2=\theta_4$.

Table 1

| | θ | a | \|en\| | \|Enα\| | \|en\|/\|Enα\| | \|Zno\| | \|Znα\| | \|Zn\|/\|Zn\| |
|---|---|---|---|---|---|---|---|---|
| TWO-ELEMENT | 1.0 | | 0.707 | 0.436 | 1.62 | 0.50 | 0.632 | 0.791 |
| | 2 | | 1.15 | 0.576 | 2.00 | 0.33 | 0.576 | 0.578 |
| FOUR-ELEMENT | 1.0 | 0.30 | 0.617 | 0.490 | 1.26 | 0.671 | 0.676 | 0.992 |
| | 2 | 0.30 | 0.940 | 0.678 | 1.39 | 0.476 | 0.588 | 0.810 |

As is clear from Table 1, for the same values of θ, that is, the width of Δ*f*, the four-element discriminator shows superiority over the two-element discriminator in detecting efficiency $|En_\alpha|$, linearity $|en|/|En_\alpha|$ and input immittance $|En_0|/|Zn_\alpha|$.

Various kinds of the four-element discriminators are possible according to the selection of the parameters, but when the parameters are selected to have a particular relation $4a\theta_4^2=1$ (in this case $0<a<1$), a four-element discriminator having excellent linearity of detecting efficiency and input immittance can be obtained as indicated by numerical examples in Table 2.

Table 2

| | θ | a | \|Enα\| | \|en\| | \|en\|/\|Enα\| | \|Zno\| | \|Znα\| | \|Zno\|/\|Znα\| |
|---|---|---|---|---|---|---|---|---|
| TWO-ELEMENT | 0.866 | | 0.377 | 0.560 | 1.50 | 0.661 | 0.570 | 1.16 |
| | 0.707 | | 0.299 | 0.408 | 1.37 | 0.705 | 0.860 | 1.22 |
| FOUR-ELEMENT | 0.866 | 0.334 | 0.423 | 0.504 | 1.19 | 0.760 | 0.726 | 1.05 |
| | 0.707 | 0.500 | 0.293 | 0.228 | 0.854 | 0.941 | 0.826 | 1.07 |

From the foregoing theory, it will be seen that a four-element discriminator satisfying the relation $4a\theta_4^2=1$ has a flat input immittance and detected output of excellent linearity over a wide frequency range. Therefore, the present invention provides a discriminator having excellent rise characteristic, little overshooting, and high detecting efficiency for frequency shifted waves.

It should be understood, of course, that the foregoing disclosure relates to only a preferred embodiment of the invention and that it is intended to cover all changes and modifications of the example of the invention herein chosen for the purpose of the disclosure, which do not constitute departures from the spirit and scope of the invention as set forth in the appended claim.

What we claim is:

1. A four-element discriminator, comprising two circuits each consisting of a reverse L-connection of a series tuning circuit and a parallel tuning circuit and operating on a frequeny tuned to a respective one of two specific frequencies, said two circuits being mutually connected in parallel on their series tuning circuit sides, their two parallel tuning circuits being connected to respective detector circuits differentially adding their outputs, said circuits being so selected that a parameter $\theta_4$ which indicates the ratio of the difference of said two specific frequencies to a center frequency and another parameter "*a*" which determines the type of each reverse L connection, have the relationship expressed by $4a\theta_4^2=1$.

2. A frequency discriminator using four tuning circuits each consisting of a series connection of a series tuning circuit and a parallel tuning circuit and operating on a frequency tuned to one of two specific frequencies and two detector circuits for producing outputs corresponding to said two specific frequencies, said two circuits being mutually connected in parallel on their series tuning circuit sides, their two parallel tuning circuits being connected to said respective detector circuits, said circuits being so selected that a parameter $\theta_4$, which indicates the ratio of the difference of said two specific frequencies to a center frequency, and another parameter *a*, which determines the type of each series connection, possess the relationship expressed by $4a\theta_4^2=1$.

References Cited

UNITED STATES PATENTS 2,975,299 3/1961 Mintzer -------- 307—88.5–7.3
3,210,570 10/1965 Brock et al. ----- 307—88.5–7.2
3,265,976 8/1966 Broadhead --------- 325—320

ALFRED L. BRODY, *Primary Examiner.*